United States Patent
Sullivan

(10) Patent No.: US 11,162,633 B2
(45) Date of Patent: Nov. 2, 2021

(54) MAGNETIC MOUNT FOR ELECTRONIC DEVICES

(71) Applicant: Microsoft Technology Licensing, LLC, Redmond, WA (US)

(72) Inventor: Timothy M. Sullivan, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 55 days.

(21) Appl. No.: 16/510,813

(22) Filed: Jul. 12, 2019

(65) Prior Publication Data
US 2021/0010635 A1    Jan. 14, 2021

(51) Int. Cl.
*F16M 13/00* (2006.01)
*H01F 7/02* (2006.01)
*H05K 7/14* (2006.01)

(52) U.S. Cl.
CPC ............ *F16M 13/005* (2013.01); *H01F 7/02* (2013.01); *H05K 7/14* (2013.01); *H01F 7/0215* (2013.01)

(58) Field of Classification Search
CPC ....... F16M 13/005; H01F 7/02; H01F 7/0215; H01F 7/0205; H01F 7/0221; H05K 7/14
USPC ......... 248/683, 686, 467, 489, 206.5, 205.3, 248/205.4, 309.4, 323, 324, 685; 361/679.01, 679.02, 679.21, 679.25, 361/679.26, 679.29, 679.58
See application file for complete search history.

(56) References Cited

U.S. PATENT DOCUMENTS

| 4,840,337 A | * | 6/1989 | Zaugg | B62J 6/02 248/115 |
| 4,907,769 A | * | 3/1990 | Hunley, Jr. | F21V 21/06 248/185.1 |
| 6,059,010 A | * | 5/2000 | Yang | B60J 11/02 160/24 |
| 6,267,341 B1 | * | 7/2001 | Fleming | B23Q 17/20 248/181.2 |
| 6,279,885 B1 | * | 8/2001 | Leon, Jr. | B23K 37/0435 269/8 |
| 6,491,271 B1 | * | 12/2002 | Adams | A47G 1/17 248/206.5 |

(Continued)

FOREIGN PATENT DOCUMENTS

| CN | 103292568 A | 9/2013 |
| WO | 2005047786 A1 | 5/2005 |

OTHER PUBLICATIONS

"International Search Report and Written Opinion Issued in PCT Application No. PCT/US20/035495", dated Sep. 3, 2020, 10 Pages.

*Primary Examiner* — Eret C McNichols
*Assistant Examiner* — Michael McDuffie

(57) ABSTRACT

An electronic device mount includes a rigid cover, a flexible cover, and a frame positioned between the rigid cover and the flexible cover. The frame has a plurality of openings. The electronic device mount further includes a plurality of rocker arms coupled within correspond openings of the frame, and to the flexible cover. The plurality of rocker arms are configured to pivot within the plurality of openings to deflect the flexible cover relative to the frame to define a curved outer surface of the flexible cover. The electronic device mount also includes a plurality of magnets coupled to one of the frame or the flexible cover. The deflection of the flexible cover is self-adjusting to allow for easy mounting of an electronic device to a curved metal surface.

20 Claims, 6 Drawing Sheets

(56) References Cited

U.S. PATENT DOCUMENTS

| | | | | |
|---|---|---|---|---|
| 7,624,957 | B2* | 12/2009 | Klein | H01Q 1/1221 |
| | | | | 248/206.5 |
| 9,038,971 | B1* | 5/2015 | Guthrie | F16M 11/40 |
| | | | | 248/121 |
| 9,273,819 | B2* | 3/2016 | Pinchevski | F16M 13/022 |
| 9,472,937 | B2* | 10/2016 | Klein | H02G 3/32 |
| 10,078,346 | B2 | 9/2018 | Lay et al. | |
| 10,627,043 | B2* | 4/2020 | Wargo | F16M 13/02 |
| 2006/0278779 | A1* | 12/2006 | Killion | G09F 7/04 |
| | | | | 248/206.5 |
| 2007/0200038 | A1* | 8/2007 | Dautrey | B25B 5/06 |
| | | | | 248/206.5 |
| 2011/0304519 | A1* | 12/2011 | Klein | H01Q 1/1242 |
| | | | | 343/890 |
| 2014/0103169 | A1* | 4/2014 | Heard | B63B 27/146 |
| | | | | 248/65 |
| 2014/0263939 | A1* | 9/2014 | Rinner | F16M 11/10 |
| | | | | 248/688 |
| 2014/0266526 | A1* | 9/2014 | Swift, Jr. | H01F 7/0215 |
| | | | | 335/306 |
| 2015/0191124 | A1* | 7/2015 | Du | F16M 13/00 |
| | | | | 248/205.4 |
| 2015/0305502 | A1* | 10/2015 | Wengreen | H05K 5/0204 |
| | | | | 248/205.3 |
| 2016/0102809 | A1* | 4/2016 | Kikuchi | F16M 13/025 |
| | | | | 248/206.5 |
| 2016/0116944 | A1* | 4/2016 | Lee | H04M 1/0216 |
| | | | | 361/679.26 |
| 2016/0149386 | A1* | 5/2016 | Stechmann | H02G 3/32 |
| | | | | 248/68.1 |
| 2018/0178375 | A1* | 6/2018 | Yang | B25J 19/00 |
| 2020/0036825 | A1* | 1/2020 | Cheswick | H04M 1/04 |

* cited by examiner

MAGNETIC MOUNT FOR ELECTRONIC DEVICES

BACKGROUND

Portable electronic devices, such as tablet computers, laptops, mobile phones, and the like are increasingly used for many different applications. For example, mobile computing devices have been developed to increase the functionality that is made available to users in a different settings. A user may interact with a mobile phone, tablet computer, or other mobile computing device to check email, surf the web, compose texts, interact with applications, and so on.

As the different applications and uses for portable electronic devices increases, different mounting and positioning of the these devices is desirable. Conventional mounting arrangements allow these devices to be angled on a table/desk or coupled to different surfaces, such as using suction cups or mechanical fasteners (e.g., screws), however the conventional mounting arrangements do not effectively allow for mounting of portable electronic devices, particularly larger portable devices, such as tablets, to metallic surfaces (e.g., ferrous surfaces) and can also permanently damage the appearance thereof (e.g. scratches or screw mounting holes). This is particularly the case for magnetic surfaces having a curvature, such as a refrigerator having curved doors. Conventional mounting arrangements often to fail to maintain engagement to the magnetic surfaces and in many instances, cannot properly couple with a curved surface, thereby causing the tablet to slide, wobble, or otherwise not be held in place. That is, conventional mounting arrangements, particular for mounting to metal surfaces using magnets, are adapted only for mounting on flat metal surfaces.

Thus, typical ways of adapting portable electronic devices for other mounting uses, such as magnetic mounting, especially when mounting on curved metal surfaces, can be awkward, detract from the aesthetics associated with the portable electronic device or object to which it is mounted, and/or cannot satisfactorily hold the portable electronic device in place. Other mounting arrangements require physical attachments, such as adhesive attachment to the portable device or mounting surface, or use of screws or other fasteners that cause permanent damage to the surfaces.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

An electronic device mount comprise a rigid cover, a flexible cover, and a frame positioned between the rigid cover and the flexible cover. The frame comprises a plurality of openings. The electronic device mount further comprises a plurality of rocker arms coupled within correspond openings of the frame, and to the flexible cover. The plurality of rocker arms are configured to pivot within the plurality of openings to deflect the flexible cover relative to the frame to define a curved outer surface of the flexible cover. The electronic device mount also comprises a plurality of magnets coupled to one of the frame or the flexible cover.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Corresponding reference characters indicate corresponding parts throughout the drawings. In the figures, the systems are illustrated as schematic drawings. The drawings may not be to scale.

DETAILED DESCRIPTION

Mounting devices described herein are configured to mount an electronic device, particularly magnetically mount the electronic device to a curved surface (e.g., a curved door of a refrigerator or other appliance). For example, the mounting device allows the electronic device to be mounted to different curved ferrous surfaces. In one example, a magnetic mount for a tablet device attaches to curved surfaces without user adjustment. The mounting device includes magnets that magnetically couple, for example to ferrous objects or surfaces, such as ferrous appliances, even ones with curved surfaces or faces. The mounting device is also configured to mount to non-ferrous surfaces using adhesives or other suitable fasteners.

The mounting device generally includes internal rocker arms, a flex plate, and guides to allow the mounting device to attach securely to a curved surface and provide a rigid structural base for the device, such as the tablet. The sturdy base allows users to comfortably use the touchscreen of the tablet without the device rocking or flexing and falling off the surface to which it is mounted.

The mounting device adapts to various curved surfaces using the rocker arms and flex plate that allows the mount to match the curvature of refrigerators or other curved mounting surfaces. The flexible characteristics of the mounting device allows for adjustable curvature within a range and adjusts automatically so the user does not have any setup or adjustment in order to use the mounting device. For example, the user places the mounting device on a refrigerator, and the flex plate flexes to match the curvature of the refrigerator and allows the magnets to magnetically hold the mounting device firmly in place. That is, a flex side of the mounting device adapts to the curvature of the refrigerator. A device engagement side provide a flat surface to which the tablet is magnetically coupled. As a result, mounting of portable electronic devices, such as tablets, to ferrous objects having curved surfaces is easily and securely performed.

Figure 1:
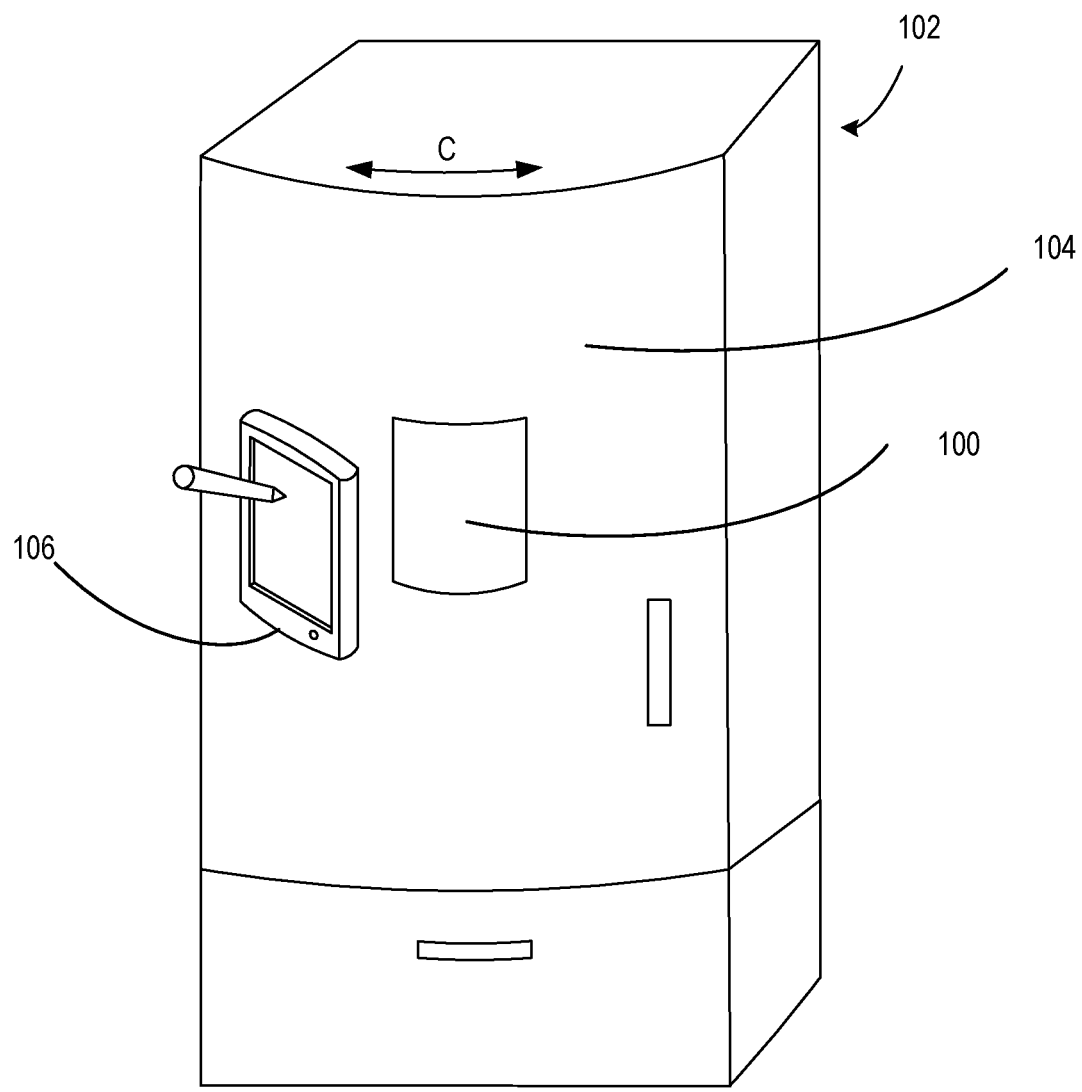
FIG. 1 illustrates an electronic device mounting arrangement in an appliance environment according to an embodiment.

More particularly, as illustrated in FIG. 1, showing a refrigerator mounting application, a mounting device 100 is configured as an electronic device mount to magnetically mount to a refrigerator 102. In the example, a portion of the mounting device 100 is flexible or bendable to allow a shape of one side of the mounting device 100 to conform to a curvature (C) of a door 104 of the refrigerator 102. That is, the mounting device 100 has magnets therein (not shown in FIG. 1) and is configured to flex in a curved configuration to allow for magnetic coupling to the door 104, which in the illustrated example is a ferrous door. Additionally, magnets within the mounting device 100, which can be the same or different magnets than the magnets used to magnetically couple the mounting device 100 to the refrigerator 102, are configured to magnetically couple the mounting device 100 to a portable electronic device 106, illustrated as an electronic tablet.

It should be appreciated that the mounting device 100 is adapted to magnetically couple to any ferrous surface of the refrigerator 102, or other ferrous objects or metal objects, or objects having ferrous surfaces or that are attracted to magnets. Also, the mounting device 100 is configured to allow different devices to be mounted thereto (on a planar frontside surface), such as different sized and shaped portable electronic devices, such as different sized and shaped tablets or computing devices. For example, the XY dimension of the mounting device 100 is shaped and sized to match the shape and size of a tablet device. Additionally, the thickness of the mounting device 100 in some examples is six millimeters (mm). However, different XY dimensions and thickness are contemplated, such as based on the particular application.

The mounting device 100 thereby allows the portable electronic device 106 to be physically secured to the refrigerator 102 through the use of magnetic attraction. That is, the magnets within the mounting device 100 allows the mounting device 100 to magnetically couple to complementary magnetic or ferrous surfaces, such as to the door 104 of the refrigerator 102 and the tablet 106. As such, the tablet 106 is securely and easily removably mounted to the refrigerator 102 along the curved ferrous surface of the door 104.

It should be noted that the mounting device 100 in various examples is configured to mount to any surface that is capable of magnetic coupling. For example, the mounting device 100 is capable of mounting to objects or surfaces formed of materials containing iron, steel, nickel, and cobalt. As other examples nonlimiting examples, the mounting device is capable of mounting to objects or surfaces formed from different types of metals, such as ferromagnetic, paramagnetic and diamagnetic metals.

Figure 2:
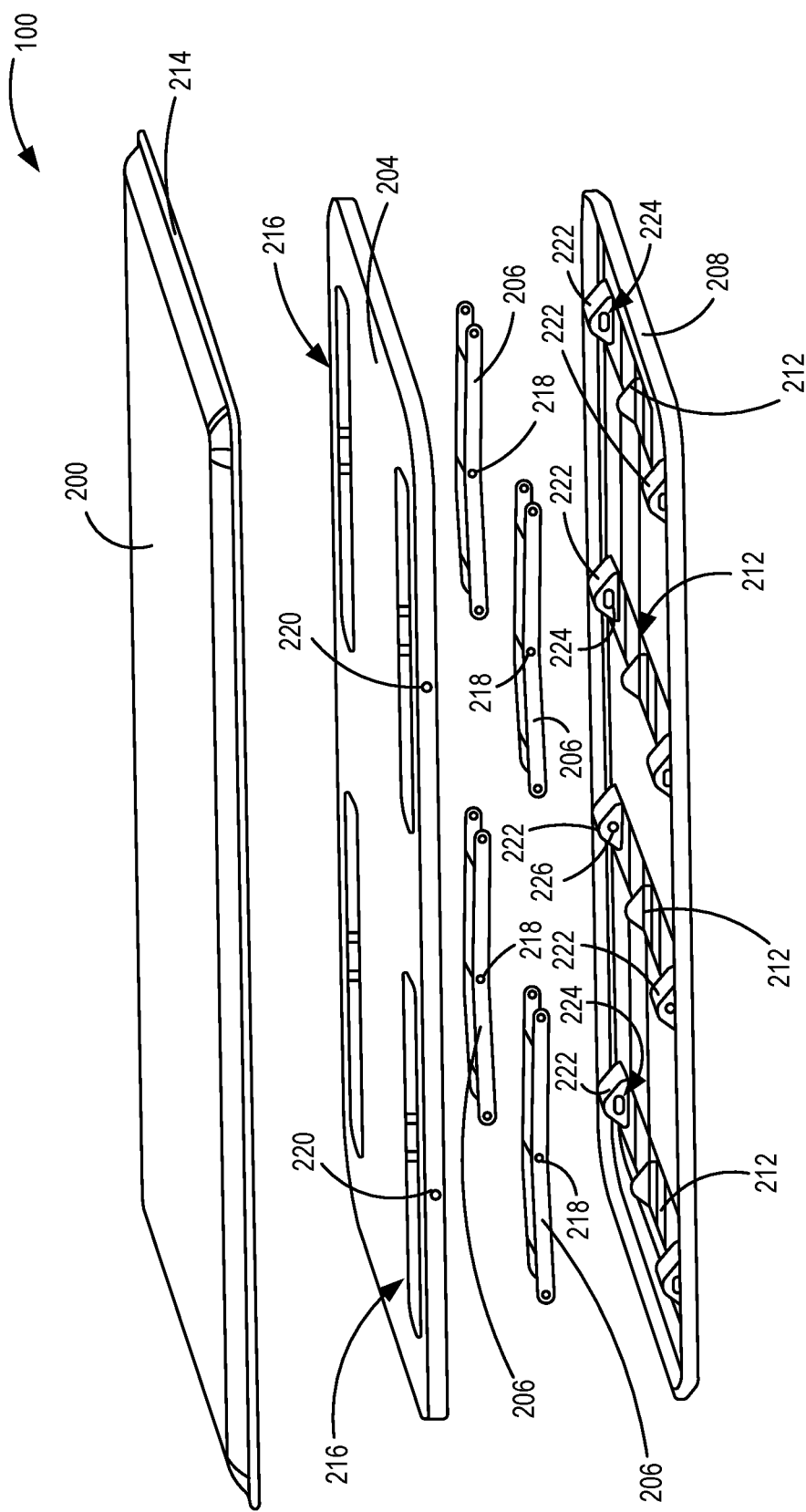
FIG. 2 is an exploded view of a mounting device according to an embodiment.
Figure 3:
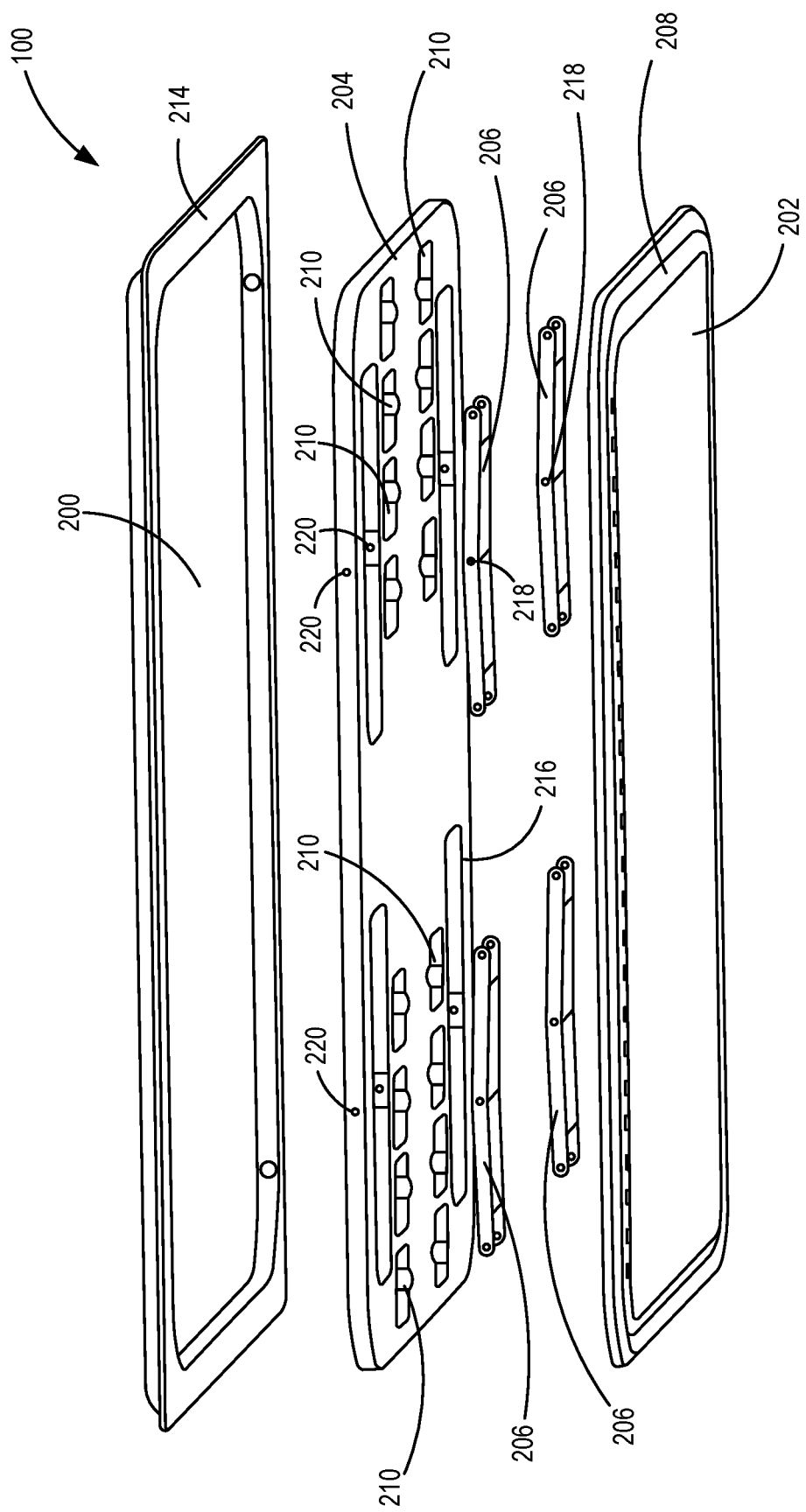
FIG. 3 is another exploded view of the mounting device of FIG. 2.

One example, of the mounting device 100 is illustrated in FIGS. 2 and 3. As can be seen, the mounting device 100 generally includes front and back surfaces defined by a cover 200 (e.g., a cosmetic cover) and a flexible plate 202 (also referred to herein as a flex plate), respectively, a frame 204, a plurality of rocker arms 206, a flex plate gasket 208, a plurality of device mounting magnets 210, and a plurality of surface mounting magnets 212. The mounting device 100 allows the electronic device to magnetically mount, for example to a ferrous surface, while conforming to a curvature of the mounting surface.

More particularly, the cover 200 is configured to allow an electronic device (such as the tablet 106 shown in FIG. 1) to be magnetically coupled thereto. For example, the cover 200 is planar to allow abutting engagement and magnetic attraction to the electronic device using the plurality of device mounting magnets 210. That is, when the electronic device is brought in abutting engagement with the cover 200, the electronic device is magnetically attracted and magnetically coupled to the surface of the cover 200. The cover 200 is thereby configured as a frontside surface that remains visible when the mounting device 100 is secured to the ferrous surface. The cover 200 in one example includes a peripheral edge 214 that engages the flex plate gasket 208 as will be described in more detail herein. The peripheral edge 214 extends outward from cover 200 (as a rim around the perimeter or periphery of the cover 200) to define an engagement surface with the flex plate gasket 208 when the mounting device 100 is assembled.

It should be appreciated that the cover 200 can be formed from different materials, such a plastic, which can include a rubberized, fabric or decorative covering. The cover 200, in some examples, is formed from a colored plastic to have an aesthetically pleasing appearance (e.g., decorative cover) when mounted to a ferrous surface and the electronic device mounted thereto. That is, the mounting device 100 can remain secured to the ferrous surface after the electronic device is removed, while having an aesthetically pleasing appearance, or that otherwise does not detract from the appearance of the ferrous surface (e.g., the refrigerator 100 shown in FIG. 1). The cover 200 in some examples is a cosmetic or decorative cover that covers the frame 204 and internal components of the mounting device 100.

Opposite to the cover, and defining a backside of the mounting device 100 in the illustrated example is the flexible plate 202, which is configured to flex or deflect, and contour to a curved surface to which the mounting device 100 is magnetically coupled. The flexible plate defines a back cover of the mounting device 100 and can be formed from any material suitable for curved bending, such as a flexible composite or plastic material, a rubber material, or other materials that allow for a desired amount of bending without cracking or breaking. The flexible plate 202 includes the flex plate gasket 208 coupled along the periphery or edge of the flex plate gasket 208 to allow engagement with the peripheral edge 214 of the cover 200. That is, the flex plate gasket 208 (e.g., rubber gasket) extends over the peripheral edge 214 of the cover 200 and allows for stretching or accordion movement thereof such that the components within the mounting device 100 remain covered or hidden as the flexible plate 202 flexes or curves relative to the rigid cover 200. The flex plate gasket 208 is configured to accommodate a gap that would otherwise exist between the flexible plate 202 and the cover 200 as the flexible plate 202 bends or curves to conform to the curved surface to which the mounting device 100 is coupled.

The frame 204 is positioned between the cover 200 and the flexible plate 202 and is configured as a rigid support structure within the mounting device 100. The frame 204 is formed from a material that provide a rigid structure, such as aluminum. However, other materials that allow for a thin rigid construction can be used. In various examples, the frame 204 is formed from a non-ferrous material with rigidity properties that support the cover 204, such as when the electronic device is magnetically coupled thereto. The frame 200 further includes a plurality of openings 216 sized and shaped for receiving therein the plurality of rocker arms 206 that act as guides and allow pivoting and rocking movement of the plurality of rocker arms 206 as described in more detail herein. That is, the plurality of openings 216 are sized and shaped according to the size and shape of the plurality of rocker arms 206, which in the illustrated example are two sets of openings positioned to correspond to the two sets of rocker arms 206. The plurality of rocker arms 206 can take different configurations, such as being different sized or shaped lever arms or pivoting arms. In the illustrated example, the plurality of rocker arms 206 are generally curved arms.

Figure 4:
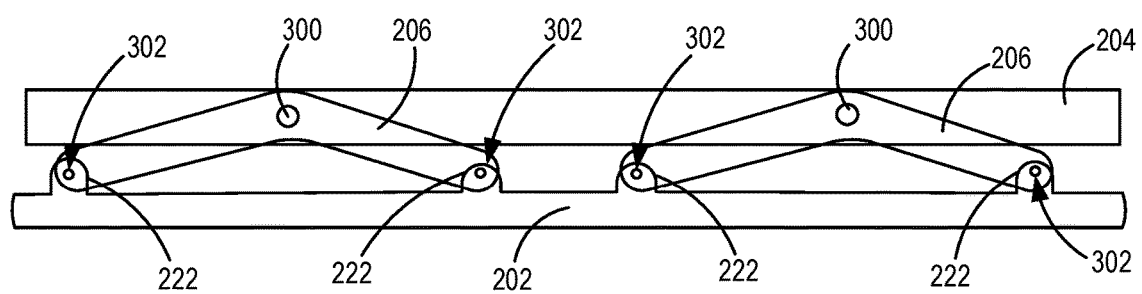
FIG. 4 is an illustration of a mounting device in a non-deflected state according to an embodiment.
Figure 5:
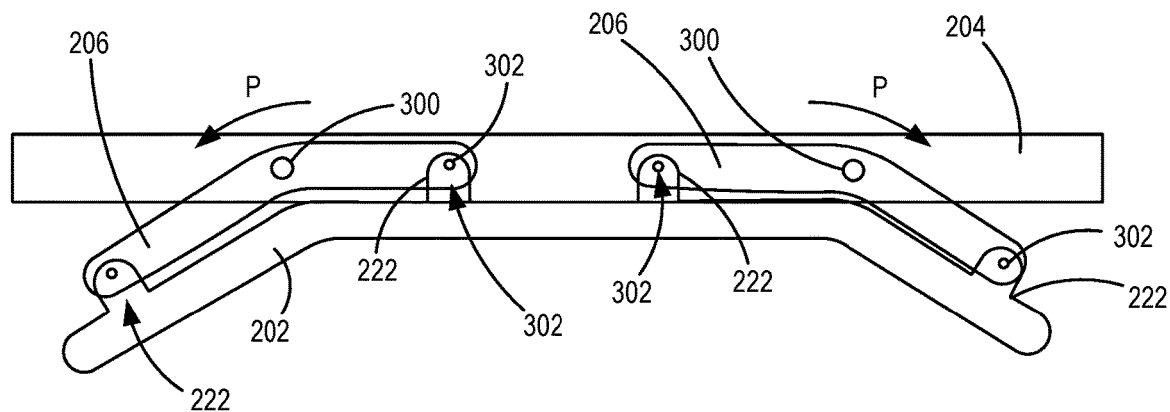
FIG. 5 is an illustration of a mounting device in a deflected state according to an embodiment.

In some examples, the plurality of openings 216 are elongated slots in which a center portion of corresponding ones of the plurality of rocker arms 206 are pivotally mounted. The pivotal mounting in one example includes pins extending through the plurality of rocker arms 206 (inserted through a center of the each of plurality of rocker arms 206) that engage within holes 220 within the each of the plurality of openings 216 that allow for pivoting and/or rocking movement. For example, the pins (as illustrated in FIGS. 4 and 5) of the plurality of rocker arms 206 extend from the sides thereof and into corresponding ones of the holes 220. In one configuration, the plurality of rocker arms 206 are positioned within the plurality of openings 216 with the pins inserted through holes 220 on one side of each of the plurality of openings 216, through openings in the center of the plurality of rocker arms 206 and finally through corresponding holes 220 on the opposite side of the plurality of openings 216. As such, the plurality of rocker arms 206 are allowed to pivotally move and rock within the plurality of openings 216.

The ends of the plurality of rocker arms 206 are coupled to corresponding end mounts 222 of the flexible plate 202 using a similar configuration. That is, each end of the plurality of rocker arms 206 is coupled to a corresponding end mount 222, which in some examples, is provided with pins extending through each of the ends of the plurality of rocker arms 206. In the illustrated example, at least some of the sets of end mounts 222 include slots 224 for receiving a pin extending through an end of one plurality of rocker arms 206, and at least one set of the end mounts 222 includes holes 226 for receiving a pin. As shown, the right two sets of end mounts 222 and the leftmost end mount 222 each include slots 224, and the middle left end mount 222 includes the holes 226. Accordingly, the ends of the plurality of rocker arms 206 coupled to the end mounts 222 with the slots 224 are configured for sliding movement within the slots 224 as the flexible plate 202 flexes or bends as described herein. The ends of the plurality of rocker arms 206 coupled to the end mounts 222 with the holes 226 are fixedly coupled therein to allow pivoting movement, but not sliding movement as the flexible plate 202 flexes or bends as described herein. Thus, the holes 226 define fixed mounting positions and the slots 224 define moving mounting positions (e.g., slidable).

The frame 204 also includes the device mounting magnets 210, which can be integrated therewith or coupled (e.g., adhesively attached or inserted) within openings of the frame 204. It should be noted that while four sets of two device mounting magnets 210 are shown on each end of the frame 204, additional or fewer magnets can be used. In one example, the device mounting magnets 210 are rare earth magnets, but magnets formed from other metals/materials can be used that allow for the magnetic coupling described herein. The device mounting magnets 210 in one example are configured (e.g., positioned) to magnetically couple to the device placed in abutting contact with the cover 200. That is, the device mounting magnets 210 magnetically hold the device to the mounting device 100.

The surface mounting magnets 212 are coupled with the flexible plate 202 similar to the arrangement for mounting the device mounting magnets 210 to the frame 204. For example, the surface mounting magnets 212 in some examples are integrated with or coupled (e.g., adhesively attached) to the inside surface of the flexible plate 202 or inserted within openings/recesses or mounting areas of the flexible plate 202. While four surface mounting magnets 212 are shown being positioned between each pair of end mounts 222, fewer or additional surface mounting magnets 212 can be used and positioned similarly or differently than shown. In one example, the surface mounting magnets 212 are rare earth magnets, but magnets formed from other metals/materials can be used that allow for the magnetic coupling described herein. The surface mounting magnets 212 in one example are configured (e.g., positioned) to magnetically couple the mounting device 212 to the curved surface (e.g., refrigerator door 104 shown in FIG. 1) when the flexible plate 202 flexes or bends to conform to the contour of the curved surface. In one example, as the mounting device 100 is positioned adjacent to the curved surface, the surface mounting magnets 212 are magnetically attracted to the ferrous material of the curved surface and cause the flexible plate 202 to flex or bend to conform to the curved ferrous surface and magnetically couple thereto.

Thus, in operation, the flexible plate 202 flexes or bends to conform to the curved ferrous surface as a result of the pivoting movement of the plurality of rocker arms 206 as illustrated in FIGS. 4 and 5, showing non-deflected and deflected states, respectively. That is, in some examples, the pivoting connection of the plurality of rocker arms 206 to the frame 204, and the pivoting and sliding connection of the plurality of rocker arms 206 to the flexible plate 202, allows the flexible plate 202 to deflect such a middle portion deflects towards the frame 204 and the end portions deflect away from the frame 204. In the illustrated example, pins 300 pivotally couple the plurality of rocker arms 206 to the frame 204, and pins 302 slidingly or pivotally couple the plurality of rocker arms 206 to the end mounts 222 to allow the deflection of the flexible plate to define an outer curved (e.g., arcuate) surface.

In operation, in the non-deflected state as shown in FIG. 4, the flexible plate 202 is planar and aligned generally parallel to the frame 204. In this non-deflected state, the mounting device 100 can still be used to mount the electronic device to a ferrous surface, such as to a flat ferrous surface. The magnetic coupling occurs in the same way to allow the electronic device to couple to the flat ferrous surface (e.g., a flat refrigerator door). The plurality of rocker arms 206 are also configured for pivoting movement (about the pins 300) as illustrated by the arrows P. That is, the plurality of rocker arms 206, which in some examples are formed from a rigid material (e.g., a rigid plastic or metal) are allowed to pivot about the pins 300 and slide along the slots 224 of the end mounts 222 (both shown in FIG. 2), such that the plurality of rocker arms 206 rotate and rock with the plurality or openings 216 to allow the flexible plate 202 to bend, such that the flexible plate 202 is curved to match the contour of the curved surface to which the mounting device 100 is attached. As should be appreciated, the outer sides of the flexible plate 202 deflect towards the frame 204 and the middle portion of the flexible plate 202 deflects towards the frame 204 as the plurality of rocker arms 206 rotate or pivot about the pins 300. This motion cause a curved surface to be formed by the flexible plate 202. That is, the flexible plate 202 bends inward at the center and outward at the ends.

The amount of deflection and curvature can be varied, such as based on the lengths of the plurality of rocker arms 206 or the maximum stretching distance of the flex plate gasket 208, or the amount of movement that is capable within the cover 200. For example, the flexible plate 202 in some examples can deflect up to a maximum of 2 mm in center, which results in 4 mm deflection at the ends. However, other deflections are contemplated, for example, 10 mm in center, which results in a deflection of 20 mm at the ends. Any amount of bending and deflection can be provided as desired or needed, such as based on the particular application (e.g., range of curvatures of refrigerator or appliance doors). It should be noted that in some examples, for an increased deflection amount, there is a corresponding increase in a thickness of the flexible plate 202. For example, the flexible plate 202 having the 10 mm/20 mm deflection in some examples is thicker than the flexible plate 202 having the 2 mm/4 mm deflection.

It should be appreciated that variations and modification are contemplated. For example, in non-magnetic mounting applications, the mounting device 100 includes openings through the frame 204 and flexible plate 202 that allows screws or other fasteners to couple the mounting device 100 to the curved surface.

Figure 6:
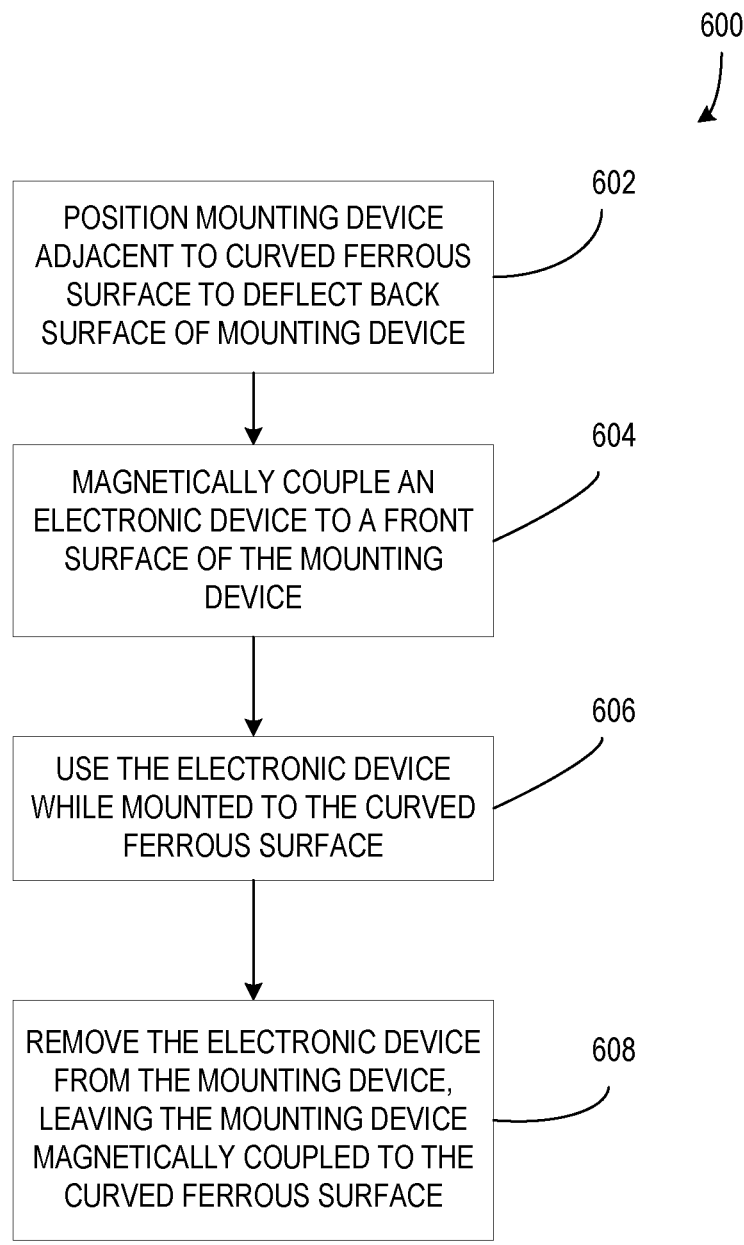
FIG. 6 illustrates a flow chart of a method for mounting an electronic device according to an embodiment.

FIG. 6 illustrates a flow chart of a method 600 for mounting an electronic device, such as an electronic device, to a ferrous (or other metal) curved surface. For example, the method 600 allows for the tablet 106 to be mounted to the curved door 104 of the refrigerator 100 (shown in FIG. 1). The operations illustrated in the flow charts described herein can be performed in a different order than is shown, can include additional or fewer steps and can be modified as desired or needed. Additionally, one or more operations can be performed simultaneously, concurrently or sequentially.

More particularly, and with reference also to FIGS. 1-5, the method 600 includes at 602 positioning a mounting device, such as the mounting device 100, adjacent to a curved ferrous surface to deflect a back surface of the mounting device. For example, as described herein, the back surface is caused to deflect and bend to contour to the curved ferrous surface as magnets within the mounting device are magnetically attracted to the ferrous surface. The mounting device can be positioned at any location and at any orientation (e.g., any rotation) on the ferrous surface, and can adjust for different amounts of curvature.

The method 600 includes magnetically coupling the electronic device to a front surface of the mounting device at 604. For example, as described herein, with the mounting device 100 magnetically coupled to the curved ferrous surface, the front surface of the mounting device remains planar. In one example, the rigidity of the cover 200 provides a flat surface to which a tablet is magnetically coupled. That is, the tablet is placed on and magnetically coupled to the front surface and held in place on the curved surface by magnetic attraction of the back surface of the tablet to magnets within the mounting device. Thus, the tablet can easily be mounted to a curved ferrous surface, such as a curved refrigerator door, and reliably held in place without wobble of movement relative to the curved surface. The tablet is then easily accessible and viewable.

The method 600 includes using the electronic device at 606 while the electronic device is mounted to the curved ferrous surface. For example, the tablet can be used by interacting with the touchscreen thereof while the tablet is coupled to the refrigerator door. A user can perform typical tablet interactions and/or view the tablet while the tablet is on the curved refrigerator door.

The method 600 includes removing the electronic device from the mounting device at 608, leaving the mounting device magnetically coupled to the curved ferrous surface. For example, with the tablet removed from the mounting device, the mounting device remains coupled to the refrigerator door, but can be moved, such as to a less conspicuous location (e.g., away from the center of the refrigerator door). Because the cover of the mounting device has an aesthetically pleasing appearance (e.g., colored or covered in material), with the tablet removed therefrom, the mounting device can stay mounted to the refrigerator door.

Figure 7:
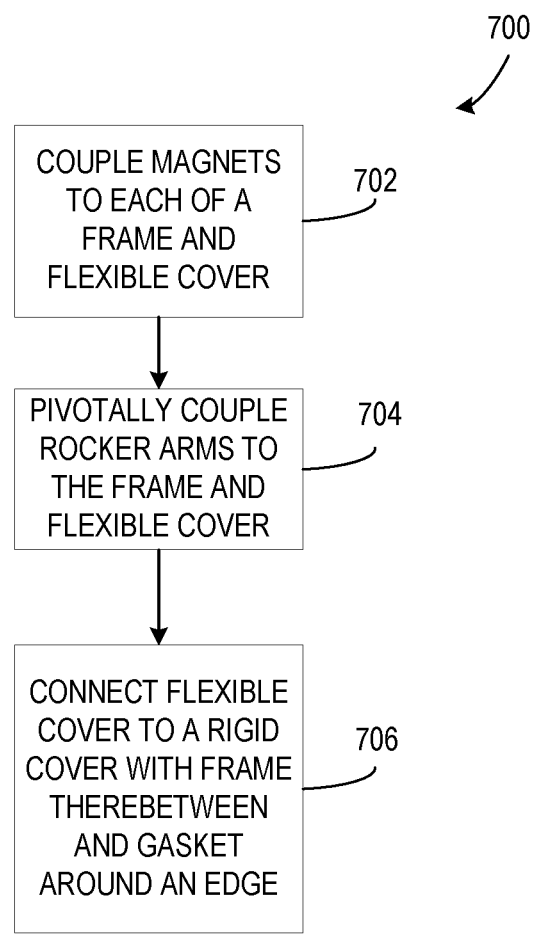
FIG. 7 illustrates a flow chart of a method for manufacturing a mounting device according to an embodiment.

FIG. 7 illustrates a flow chart of a method 700 for manufacturing a mounting device, such as the mounting device 100. For example, the method 700 allows for manufacturing and assembling the mounting device 100 to facilitate easy mounting of an electronic device to a cured ferrous surface.

More particularly, and with reference also to FIGS. 1-5, the method 700 includes at 702 coupling magnets to each of a frame and flexible cover. For example, rare earth magnets are coupled to inner surfaces of both a rigid flame and the flexible cover. The number and positioning of the magnetics is selected to provide a magnetic attraction strength that allows an electronic device, such as a tablet, to be mounted to a curved ferrous surface, such as a curved refrigerator door. The frame and flexible cover are formed from non-ferrous materials in some examples. It should be noted that in some examples, one or more of the magnets are integrated with the frame or flexible cover.

The method 700 includes pivotally coupling rocker arms to the frame and flexible cover at 704. For example, rocker arms are mounted with pins to the frame and flexible cover to allow the flexible cover to deflect to form a curved surface. The center of the rocker arms are pivotally coupled to the frame and the ends of the rocker arms are pivotally and/or slidingly (also referred to as slidably) coupled to the flexible cover in one example. The sliding engagement of the rocker arms to the flexible cover allows deflection of the flexible cover relative to the frame to form the curved surface of the flexible cover.

The method 700 includes connecting the flexible cover to a rigid cover at 706 with the frame therebetween. That is, an assembled mounting device is formed with a rigid cover on one side and a flexible cover on the other side, with the frame, magnets, and rocker arms therein. A gasket is provided around a periphery of the mounting device to keep the components hidden within the assembled mounting device. That is, the gasket is flexible and stretches as the flexible cover deflects. It should be noted that the rigid cover in some examples has an indented portion that is sized and shaped to receive at least a portion of the frame therein and also limits a pivot amount of the rocker arms in some examples (e.g., one end of the rocker arm is stopped from further movement by the rigid cover). The indented portion defines a clearance or gap in some examples that limits an extent of the rotation by stopping an end of the rocker arms at a maximum rotation amount.

Thus, a mounting device of the various examples allows for easy magnetic mounting of an electronic device to a surface, particularly a curved ferrous surface. It should be noted that the disclosure contemplates a mounting arrangement wherein different types of electronic devices (e.g., different sized and shaped tablets) are mountable to different metal surfaces using the same mounting device.

Additional Examples

Some aspects and examples disclosed herein are directed to an electronic device mount that comprises a rigid cover, a flexible cover, and a frame positioned between the rigid cover and the flexible cover. The frame comprises a plurality of openings. The electronic device mount further comprises a plurality of rocker arms coupled within correspond openings of the frame, and to the flexible cover. The plurality of rocker arms are configured to pivot within the plurality of openings to deflect the flexible cover relative to the frame to define a curved outer surface of the flexible cover. The electronic device mount also comprises a plurality of magnets coupled to one of the frame or the flexible cover.

Additional aspects and examples disclosed herein are directed to a tablet mount comprising a rigid front cover, a flexible back cover, and a non-ferrous frame positioned between the rigid front cover and the flexible back cover. The non-ferrous frame comprises a plurality of openings. The tablet mount further comprises a rocker arm pivotally coupled within each opening of the frame, and slidingly coupled to the flexible back cover. The plurality of rocker arms are configured to allow the flexible back cover to deflect relative to the frame to define a curved outer surface. The tablet mount also comprises a plurality of magnets coupled to the frame and the flexible cover. The magnets coupled to the frame are configured to magnetically coupled to a tablet and the magnets coupled to the flexible back cover are configured to magnetically couple to a curved ferrous surface.

Additional aspects and examples disclosed herein are directed to a method for manufacturing an electronic device mount. The method comprises coupling magnets to each of a frame and flexible cover and pivotally coupling rocker arms to the frame and flexible cover. The method further includes connecting the flexible cover to a rigid cover with the frame therebetween.

Alternatively, or in addition to the other examples described herein, examples include any combination of the following:

wherein at least one of the rocker arms is pivotally coupled to the flexible cover, and at least one of the rocker arms is slidingly coupled to the flexible cover;

wherein a center of each rocker arm is coupled within the corresponding opening of the frame with a pin, and ends of the at least one rocker arm are coupled to slots within end mounts of the flexible cover;

wherein the plurality of magnets are coupled to the frame and the flexible cover;

further comprising a gasket around the flexible cover and coupled to an edge of the rigid cover;

wherein the frame is a rigid frame formed from a non-ferrous material;

wherein the plurality of rocker arms are formed from a rigid plastic;

wherein the rigid cover is a front cover configured to magnetically couple to an electronic device, and the flexible cover is a back cover configured to couple to a ferrous curved surface;

wherein the rigid front cover is one of colored or covered with a colored material;

wherein the rigid cover is sized and shaped complementary to an electronic tablet;

wherein the rigid front cover is a decorative cover and further comprising a flexible and extendable gasket along edges of the rigid front cover and the flexible back cover;

wherein the plurality of rocker arms are rigid arms coupled to the non-ferrous frame and the flexible back cover with pins;

wherein the flexible back cover comprises end mounts for receiving therein pins coupled to ends of the plurality of rocker arms, three of the end mounts having slots for receiving the pins, and one of the end mounts having a hole for receiving the pin;

wherein the plurality of magnets comprises rare earth magnets aligned along the non-ferrous frame and the flexible back cover;

wherein the plurality of rocker arms comprises two pairs of two pivoting rocker arms positioned at opposite ends of the non-ferrous frame;

wherein the frame comprises a rigid non-ferrous frame and a plurality of openings for receiving therein the rocker arms;

further comprising coupling a flexible gasket around an edge of the flexible cover and the rigid cover; and wherein the flexible cover is formed of a material that allows deflection of the flexible cover relative to the frame, and the rigid cover comprises a decorative outer surface.

Exemplary Operating Environment

The present disclosure is operable with any surface on which an electronic device is to be mounted. The mounting device allows for magnetic and non-magnetic removable coupling of an electronic device, such as a tablet, to a surface, particularly a curved surface. In some examples, the mounting device is operable to mount a tablet to an appliance, such as a refrigerator with a curved door.

The electronic device can be any electronic device, such as any portable electronic device. The electronic device can have one or multiple screens, which can be a touchscreen. The electronic device can have a physical keyboard and/or a virtual keyboard.

The electronic device in various examples is a computing device. In other examples, the electronic device is a non-computing device, such as a peripheral device or display device. The electronic device is configured in some examples to interact with different input devices, such as a keyboard, stylus, electronic pen, human finger, etc.

Examples of electronic devices, environments, and/or configurations that can be suitable for use with aspects of the disclosure include, but are not limited to, mobile or portable computing devices (e.g., smartphones), personal computers, hand-held (e.g., tablet) or laptop devices, multiprocessor systems, gaming consoles or controllers, microprocessor-based systems, programmable consumer electronics, mobile telephones, mobile computing and/or communication devices in accessory form factors, network PCs, minicomputers, and the like. In general, the disclosure is operable with any portable electronic device capable of magnetic coupling.

Any range or device value given herein can be extended or altered without losing the effect sought, as will be apparent to the skilled person.

While various spatial and directional terms, such as "top," "bottom," "upper," "lower," "vertical," and the like are used to describe embodiments of the present disclosure, it is understood that such terms are merely used with respect to the orientations shown in the drawings. The orientations can be inverted, rotated, or otherwise changed, such that a top side becomes a bottom side if the structure is flipped 180 degrees, becomes a left side or a right side if the structure is pivoted 90 degrees, and the like.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above can relate to one embodiment or can relate to several embodiments. The embodiments are not limited to those that solve any or all of the stated problems or those that have any or all of the stated benefits and advantages. It will further be understood that reference to 'an' item refers to one or more of those items.

The terms 'computer', 'computing apparatus', 'mobile device' and the like are used herein to refer to any device with processing capability such that it can execute instructions. Those skilled in the art will realize that such processing capabilities are incorporated into many different devices and therefore the terms 'computer' and 'computing apparatus' each can include PCs, laptop computers, mobile telephones (including smart phones), tablet computers, media players, games consoles, personal digital assistants, and many other devices.

The term "comprising" is used in this specification to mean including the feature(s) or act(s) followed thereafter, without excluding the presence of one or more additional features or acts.

The order of execution or performance of the operations in examples of the disclosure illustrated and described herein is not essential, unless otherwise specified. That is, the operations can be performed in any order, unless otherwise specified, and examples of the disclosure can include additional or fewer operations than those disclosed herein. For example, it is contemplated that executing or performing a particular operation before, contemporaneously with, or after another operation is within the scope of aspects of the disclosure.

When introducing elements of aspects of the disclosure or the examples thereof, the articles "a," "an," "the," and "said" are intended to mean that there are one or more of the elements. The terms "comprising," "including," and "having" are intended to be inclusive and mean that there can be additional elements other than the listed elements. The term "exemplary" is intended to mean "an example of" The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. An electronic device mount comprising:
a rigid cover;
a flexible cover;
a frame positioned between the rigid cover and the flexible cover, the frame comprising a plurality of openings;
a plurality of rocker arms coupled within correspond openings of the frame, and to the flexible cover, the plurality of rocker arms configured to pivot within the plurality of openings to deflect the flexible cover relative to the frame to define a curved outer surface of the flexible cover; and
a plurality of magnets coupled to one of the frame or the flexible cover.

2. The electronic device mount of claim 1, wherein at least one of the rocker arms is pivotally coupled to the flexible cover, and at least one of the rocker arms is slidingly coupled to the flexible cover.

3. The electronic device mount of claim 2, wherein a center of each rocker arm is coupled within the corresponding opening of the frame with a pin, and ends of the at least one rocker arm are coupled to slots within end mounts of the flexible cover.

4. The electronic device mount of claim 1, further comprising a flexible plate that bends as a result of pivoting movement of the plurality of rocker arms to deflect the flexible cover relative to the frame.

5. The electronic device mount of claim 1, further comprising a gasket around the flexible cover and coupled to an edge of the rigid cover.

6. The electronic device mount of claim 1, wherein the frame is a rigid frame formed from a non-ferrous material.

7. The electronic device mount of claim 1, wherein the plurality of rocker arms are formed from a rigid plastic and further comprising a flexible plate wherein a middle portion of the flexible plate deflects towards the frame and end portions deflect away from the frame as a result of pivoting movement of the plurality of rocker arms.

8. The electronic device mount of claim 1, wherein the rigid cover is a front cover configured to magnetically couple to an electronic device, the flexible cover is a back cover configured to couple to a ferrous curved surface, and the plurality of magnets are coupled to the frame and the flexible cover.

9. The electronic device mount of claim 8, wherein the rigid front cover is one of colored or covered with a colored material.

10. The electronic device mount of claim 1, wherein the rigid cover is sized and shaped complementary to an electronic tablet.

11. A tablet mount comprising:
a rigid front cover;
a flexible back cover;
a non-ferrous frame positioned between the rigid front cover and the flexible back cover, the non-ferrous frame comprising a plurality of openings;
a rocker arm pivotally coupled within each opening of the frame, and slidingly coupled to the flexible back cover, the plurality of rocker arms configured to allow the flexible back cover to deflect relative to the frame to define a curved outer surface; and
a plurality of magnets coupled to the frame and the flexible cover, the magnets coupled to the frame configured to magnetically coupled to a tablet and the magnets coupled to the flexible back cover configured to magnetically couple to a curved ferrous surface.

12. The tablet mount of claim 11, wherein the rigid front cover is a decorative cover and further comprising a flexible and extendable gasket along edges of the rigid front cover and the flexible back cover.

13. The tablet mount of claim 11, wherein the plurality of rocker arms are rigid arms coupled to the non-ferrous frame and the flexible back cover with pins.

14. The tablet mount of claim 13, wherein the flexible back cover comprises end mounts for receiving therein pins coupled to ends of the plurality of rocker arms, three of the end mounts having slots for receiving the pins, and one of the end mounts having a hole for receiving the pin.

15. The tablet mount of claim 11, wherein the plurality of magnets comprises rare earth magnets aligned along the non-ferrous frame and the flexible back cover.

16. The tablet mount of claim 11, wherein the plurality of rocker arms comprises two pairs of two pivoting rocker arms positioned at opposite ends of the non-ferrous frame.

17. A method for manufacturing an electronic device mount, the method comprising:
- coupling magnets to each of a frame and flexible cover;
- pivotally coupling rocker arms to the frame and flexible cover to allow the flexible cover to deflect relative to the frame to define a curved outer surface of the flexible cover; and
- connecting the flexible cover to a rigid cover with the frame therebetween.

18. The method of claim 17, wherein the frame comprises a rigid non-ferrous frame and a plurality of openings for receiving therein the rocker arms.

19. The method of claim 17, further comprising coupling a flexible gasket around an edge of the flexible cover and the rigid cover.

20. The method of claim 17, wherein the flexible cover is formed of a material that allows deflection of the flexible cover relative to the frame, and the rigid cover comprises a decorative outer surface.

\* \* \* \* \*